United States Patent [19]

Hosoya

[11] 4,335,334
[45] Jun. 15, 1982

[54] HORIZONTAL SCANNING CIRCUIT

[75] Inventor: Nobukazu Hosoya, Nara, Japan

[73] Assignee: Sanyo Electric Co., Ltd., Osaka, Japan

[21] Appl. No.: 188,149

[22] Filed: Sep. 17, 1980

[30] Foreign Application Priority Data

Sep. 20, 1979 [JP] Japan ............................ 54-122442
Aug. 29, 1980 [JP] Japan ........................ 55-123602[U]

[51] Int. Cl.³ .................... H01J 29/70; H01J 29/76
[52] U.S. Cl. ................................................. 315/408
[58] Field of Search ............... 315/408, 411, 410, 409, 315/399

[56] References Cited

U.S. PATENT DOCUMENTS 3,467,882  9/1969  Young ............................... 315/408
3,512,040  5/1970  Lester ............................... 315/408

Primary Examiner—Theodore M. Blum
Attorney, Agent, or Firm—Armstrong, Nikaido, Marmelstein & Kubovcik

[57] ABSTRACT

A horizontal scanning circuit constituting a self-oscillation circuit, by providing a winding for feedback in a flyback transformer, and by positively feeding back the output signal from said winding to the base of horizontal power transistor. Since this constitution does not require transformer for impedance conversion, the circuitry is simplified.

5 Claims, 5 Drawing Figures

HORIZONTAL SCANNING CIRCUIT

BACKGROUND OF THE INVENTION

This invention relates to a horizontal scanning circuit in a television set.

Generally, a horizontal scanning circuit applies the pulse signal delivered from a horizontal oscillation circuit 90 to the base of a horizontal power transistor 93 as shown in FIG. 5. The collector of horizontal power transistor 93 is connected in series to the primary winding 95 of a flyback transformer 94. By turning on and off horizontal power transistor 93 in response to the pulse signal from horizontal oscillation circuit 90, a specified scanning current flows into a horizontal scanning coil 96 when power is supplied, thus starting the scanning of electron beam.

Usually, the base current required to excite horizontal power transistor 93 is relatively large, and, therefore, the output signal from horizontal oscillation circuit 90 should be amplified to a specified value by means of a horizontal driving transistor 91. In addition, a transformer 92 for impedance conversion is required between said driving transistor 91 and horizontal power transistor 93. Such requirements have been a significant hurdle for the miniaturization of a television set or reduction of manufacturing cost thereof.

SUMMARY OF THE DISCLOSURE

The object of the invention is intended to elucidate a horizontal scanning circuit capable of simplifying the circuitry without requiring a transformer for impedance conversion, reducing the manufacturing cost, and also decreasing the power consumption, by providing a winding for feedback in a flyback transformer, and constituting a self-oscillation circuit by positively feeding back the output signal from said winding to the base side of a horizontal power transistor.

It is further intended to present a circuit to correct the period of scanning by a horizontal power transistor and cause to coincide with the horizontal synchronizing signal, by turning the horizontal power transistor operating in ON state into OFF state by means of a control circuit which delivers a pulse signal synchronized with the horizontal synchronizing signal.

DETAILED DESCRIPTION

Figure 1:
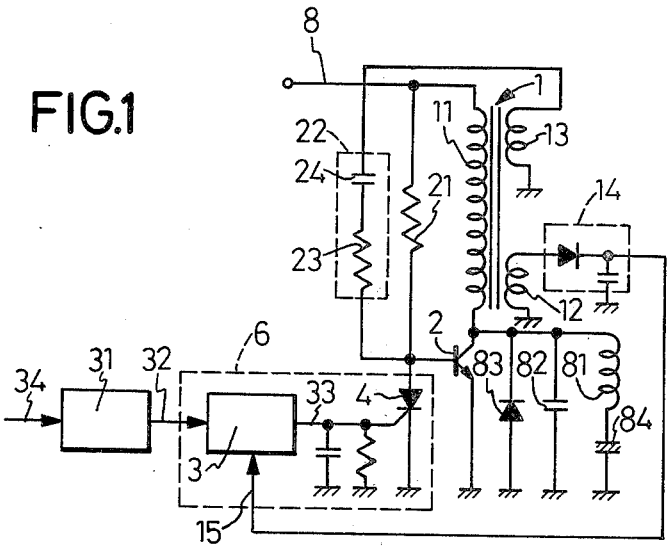
FIG. 1 is an electric circuit diagram showing first embodiment of a horizontal scanning circuit related to this invention.

FIG. 1 exhibits an embodiment of the horizontal scanning circuit related to this invention, one end of primary winding 11 of flyback transformer 1 is connected to power source line 8, while the collector of horizontal power transistor 2 for switching is connected to the other end of the primary winding 11. The emitter of said transistor 2 is grounded. Parallel to collector and emitter ends of horizontal power transistor 2 are provided a series circuit of horizontal scanning coil 81 and capacitor 84 for scanning, capacitor 82 for resonance, and diode 83 for damper, and the base thereof is connected to power source 8 by way of a resistor 21.

Said flyback transformer 1 is further equipped with a winding for power source 12 and another winding for feedback 13, and the output from the winding for power source 12 is rectified and smoothed in a rectifying circuit 14 and then applied to a horizontal oscillation circuit 3 of a control circuit 6 stated below. The feedback current from winding for feedback 13 is once brought to a specified value by means of a feedback path 22 consisting of capacitor 24 and resistor 23, and is positively fed back to the base end of said horizontal power transistor 2.

Control circuit 6 is provided with horizontal oscillation circuit 3 and SCR 4. Horizontal oscillation circuit 3 is designed to start oscillation when a driving voltage 15 is applied the winding from power source 12 and, similarly to the conventional way, it receives a control signal 32 delivered from AFC circuit 31, generates a pulse signal 33 synchronized with horizontal synchronizing signal 34, and controls SCR 4 to ON state with said signal 33.

Anode of SCR 4 is connected to the base of horizontal power transistor 2 and cathode to the ground side thereof, having its gate connected to the output side of horizontal oscillation circuit 3. By the input of pulse signal 33 to the gate of SCR 4, SCR 4 becomes ON state and force the base of horizontal power transistor 2 to the ground, defines the OFF period of said transistor 2, and controls the oscillation frequency of horizontal scanning circuit.

To simplify the drawing, the high tension winding wound around the flyback transformer is omitted.

OPERATION

Figure 2:
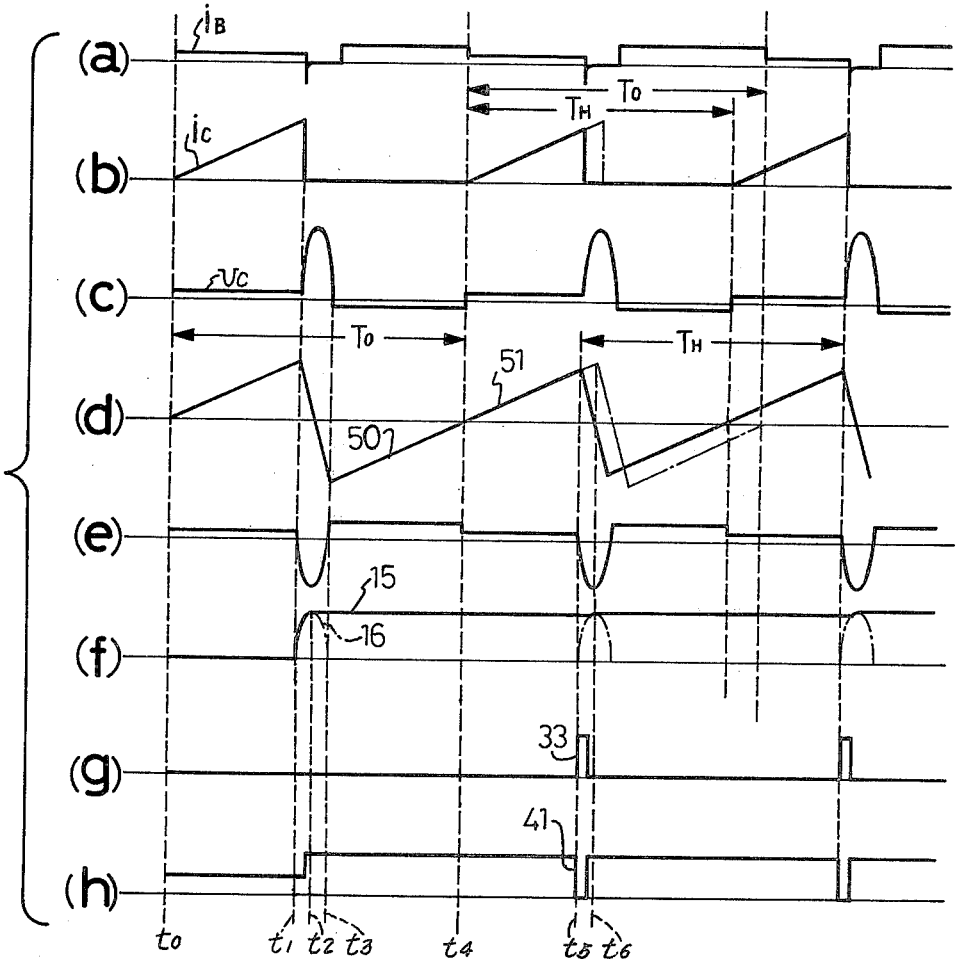
FIGS. 2a to 2h are waveforms showing the operating state of each point in the circuit.

In FIG. 2, when power switch (not shown) is closed at time $t_0$ and a voltage is applied to power source line 8, this voltage is applied to the base of horizontal power transistor 2 through resistor 21. In this transistor 2, base current $i_B$ flows in the forward direction to increase collector current $i_C$ (FIG. 2b), and the increment of collector current is positively fed back from feedback winding 13, thereby instantly turning on transistor 2. Therefore, a current linearly elevating but proportional to the time constant determined by the inductance of a primary winding 11 or a horizontal scanning coil 81 and internal resistance of transistor 2 will flow in the primary winding 11 of flyback transformer 1 and the horizontal scanning coil 81 respectively. Collector current $i_C$ of transistor 2 reaches the peak at time $t_1$ when the current $i_C$ becomes $\beta$ times of base current $i_B$ ($\beta$ is current amplification factor of transistor 2), and increase of collector current $i_C$ ceases.

As a result, the current constituting part of base current of transistor 2 generated in the feedback winding 13 of flyback transformer becomes zero, and the base current of transistor 2 naturally decreases, and collector current $i_C$ also goes down accordingly.

Decrease of collector current $i_C$ generates a negative voltage in feedback winding 13 as shown in FIG. 2e, which causes to further decrease of the base current of transistor 2.

In consequence to this positive feedback, transistor 2 is instantly turned to OFF state. When transistor 2 becomes OFF, a parallel circuit of horizontal scanning coil 81, resonance capacitor 82 and primary winding 11 of flyback transformer resonates, and collector voltage $v_C$ of transistor 2 is changed to sinusoidal wave as shown in FIG. 2c, which reaches the maximum at time $t_2$ and becomes approximately zero at time $t_3$.

The electromagnetic energy of horizontal scanning coil 81 reaches the maximum at time $t_3$.

From time $t_3$, horizontal scanning coil 81 begins to discharge erectromagnetic energy, and a current decreasing its absolute value linearly flows in a closed loop consisting of horizontal scanning coil 81, capacitor 84, and damper diode 83 (FIG. 2d). At the same time, capacitor 84 is charged.

While current is flowing in said closed loop, a positive voltage is being applied to the base of transistor 2 from resistor 21, whereas a negative voltage determined by the voltage drop of damper diode 83 is applied between the collector and emitter of transistor 2, so that collector current does not flow in transistor 2.

This state continues until the current of horizontal scanning coil 81 becomes zero at time $t_4$. From the moment when said current becomes zero, horizontal power transistor 2 returns to ON state, and a discharge current of capacitor 84 which is increasing linearly begins to flow in a closed loop consisting of horizontal scanning coil 81, collector and emitter of transistor 2, and capacitor 84 (FIG. 2d).

The current-increase in horizontal scanning coil 81 continues until collector current $i_C$ of transistor 2 reaches the peak value, carrying on up to time $t_6$ when transistor 2 is instantly turned off by positive feedback of winding for feedback 13 as in the operation mentioned above. Thereafter, this operation is repeated.

Actually, several cycles in the initial period of oscillation is transient state. In the present invention, however, since the stationary state is discussed, the time after $t_3$ is regarded as stationary state for the convenience of description.

Meanwhile, driving power source 15 in horizontal oscillation circuit 3 is obtained by rectifying and smoothing the pulse signal 16 of winding for power source 12, which is the secondary winding of flyback transformer, and since this pulse signal 16 is generated within the flyback time ($t_1$ to $t_3$), power source voltage is not applied to horizontal oscillation circuit until it passes flyback time, and the horizontal oscillation circuit 3 does not oscillate. After the first flyback time, however, the D.C. voltage generated in the driving power source 15 is applied to horizontal oscillation circuit 3, which, hence, starts to oscillate.

At this time, natural oscillation frequency $f_0$ (period $T_0$) of horizontal scanning circuit is set slightly lower than the horizontal oscillation frequency $f_H$ (period $T_H$) ($T_0 > T_H$). Besides, as mentioned above, since stationary state is assumed after time $t_3$, the first pulse of pulse signal 33 from horizontal oscillation circuit 3 occurs at time $t_5$, slightly earlier than time $t_6$ as shown in FIG. 2g.

As shown in FIG. 2b, slightly before collector current $i_C$ of transistor 2 reaches the peak (time $t_5$), pulse signal 33 is applied to the gate of SCR 4, which then becomes ON. Therefore, at the same time, since the base of transistor 2 is grounded, transistor 2 is forced to be cut off, and the oscillation frequency of horizontal scanning circuit is locked at the horizontal oscillation frequency ($f_H$), i.e., the frequency of synchronizing signal 34.

SECOND EMBODIMENT

Figure 3:
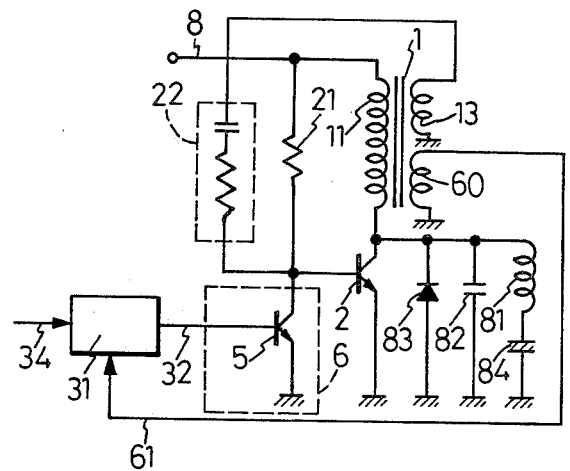
FIG. 3 and 4 are electric circuit diagrams showing second and third embodiments, respectively.

In the embodiment shown in FIG. 3, transistor 5 for base current shunting is used as control circuit 6, and control voltage 32 delivered from an integrating circuit of AFC circuit 31 is directly applied to the base of transistor 5. The AFC circuit 31 compares the phase of horizontal synchronizing signal 34 with a phase of flyback pulse 61 produced from a pulse producing winding 60 of flyback transformer 1 and integrates the compared output signal. In this embodiment, while keeping the transistor 5 during scanning period in linear state, and varying the internal resistance between collector and emitter by means of control voltage 32, part of the base current of horizontal power transistor 2 is shunted and controlled to vary the time of collector current $i_C$ reaching $\beta i_B$, thus controlling the oscillation frequency of horizontal scanning circuit.

THIRD EMBODIMENT

Figure 4:
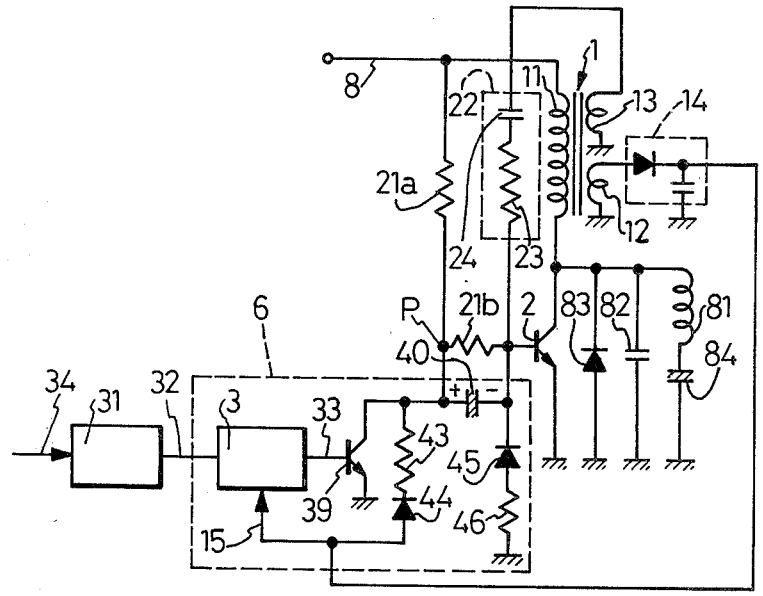
Figure 5:
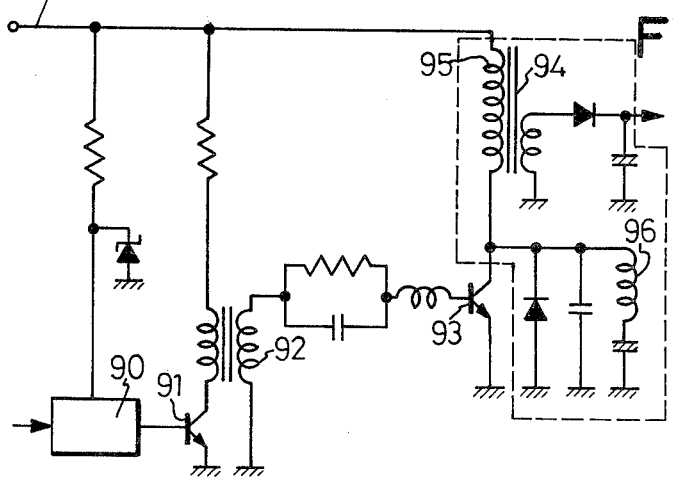
FIG. 5 is an electric circuit diagram indicating a conventional horizontal scanning circuit.

In the embodiment shown in FIG. 4, two resistors 21a, 21b are provided between the base of horizontal power transistor 2 and power source line 8, and capacitor 40 is connected parallel to resistor 21b. One end of parallel connection of resistor 21b and capacitor 40 is connected to the base of transistor 2, while the other end is connected to the collector of transistor 39 and one end of resistor 21a. The emitter and base of transistor 39 are connected to the ground and horizontal oscillation circuit 3, respectively.

The collector of transistor 39 is connected to driving power source 15 by way of a series circuit of resistor 43 and diode 44.

The base of transistor 2 and the ground are connected with an excessive reverse bias preventing circuit consisting of series circuit of resistor 46 and diode 45.

Since the D.C. voltage of driving power source 15 is applied to the charge/discharge capacitor 40 through a diode 44 for preventing reverse current and a register 43 for limiting current, said capacitor 40 is charged to the polarity as shown in FIG. 4 with closed loop current passing from the power supply 15 to ground through diode 44, register 43, capacitor 40 and base to emitter of horizontal power transistor 2.

Therefore, when drive transistor 39 becomes on state (refer to FIG. 2h, which shows the collector waveform of drive transistor 39), voltage charged in said capacitor 40 is applied between base and emitter of horizontal power transistor 2 as a reverse bias, then, horizontal power transistor 2 is turned off immediately at time $t_5$.

In this period, when drive transistor 39 is at ON state, the point P is grounded therefore base current (forward) does not pass the said transistor 2 through registor 21a, 21b. Consequently turn off of the transistor 2 is ensured.

Generally, since transistor 2 is for large power service, accumulation of carriers charged in the base region is high, therefore delay of turn off time is large. But in the circuit shown in FIG. 4 the turn off time is shortened by applying a negative voltage between base and emitter of transistor 2 from capacitor 40, and passing the base current instantaneously in the reverse direction.

I claim:

1. A horizontal scanning circuit comprising:
  (a) a flyback transformer;
  (b) a horizontal scanning coil connected to said flyback transformer;
  (c) a power transistor connected to said flyback transformer and said horizontal scanning coil for controlling the current flow therethrough;
  (d) control circuit means connected to said power transistor for controlling the control current thereto, wherein said control circuit means provides a pulse signal for switching said power transistor between ON and OFF states at a frequency $f_H$ which is higher than $f_0$, the natural frequency of said scanning circuit, said control circuit means comprising a horizontal oscillation circuit means for varying the frequency $f_H$ in response to a control signal applied thereto, a switching means having a control input connected to the output of said horizontal oscillation circuit means and one electrode thereof connected to ground, a capacitor means having one side thereof connected to said switching means and the other side thereof connected to said power transistor, and a resistor connected in parallel with said capacitor means, wherein said capacitor means is charged when said power transistor is ON and, when said switching means turns ON in response to an output pulse from said horizontal oscillation circuit means, one side of said resistor is grounded through said switching means whereby the voltage across said capacitor means is applied to said horizontal power transistor such that said horizontal power transistor is reverse biased and thereby turned OFF; and (e) a feedback winding included in said flyback transformer for feeding back a signal to said horizontal power transistor for causing the self-oscillation thereof.

2. A horizontal scanning circuit as set forth in claim 1 wherein said switching means comprises a transistor.

3. A horizontal scanning circuit as set forth in any one of claims 1 or 2 wherein said control circuit means includes a diode and a resistor connected in series between said flyback transformer and said one side of said capacitor means for preventing the flow of reverse current from a DC power source.

4. A horizontal scanning circuit as set forth in claim 1 wherein said control circuit means includes a series circuit of a diode and resistor connected between said power transistor and ground for preventing the application of an excessive reverse bias to said power transistor.

5. A horizontal scanning circuit as set forth in claim 1 including a rectifying circuit connected between said flyback transformer and said control circuit means for providing DC power to said control circuit means.

* * * * *